United States Patent [19]

Beneking

[11] Patent Number: 4,974,037
[45] Date of Patent: Nov. 27, 1990

[54] SEMICONDUCTOR ARRANGEMENT WITH DEPLETION LAYER MAJORITY CARRIER BARRIER

[75] Inventor: Heinz Beneking, Aachen, Fed. Rep. of Germany

[73] Assignee: Telefunken electronic GmbH, Heilbronn, Fed. Rep. of Germany

[21] Appl. No.: 117,847

[22] Filed: Nov. 9, 1987

[30] Foreign Application Priority Data

Nov. 18, 1986 [DE] Fed. Rep. of Germany ....... 3639433

[51] Int. Cl.$^5$ .................... H01L 29/80; H01L 29/201
[52] U.S. Cl. ........................................ 357/22; 357/15; 357/16
[58] Field of Search ................ 357/15, 22 MD, 23.14, 357/16

[56] References Cited

U.S. PATENT DOCUMENTS

| Re. 29,971 | 4/1979 | Nishizawa et al. | 357/12 |
| 3,786,319 | 1/1974 | Tomisaburo | 357/23.14 |
| 4,228,444 | 10/1980 | Togei | 357/22 |
| 4,455,564 | 6/1984 | Delagebeandeuf | 357/22 |
| 4,632,713 | 12/1986 | Tiku | 357/15 |

FOREIGN PATENT DOCUMENTS

| 0100529 | 2/1984 | European Pat. Off. | 357/22 |
| 3402517 | 8/1985 | Fed. Rep. of Germany | 357/22 |
| 3545435 | 6/1986 | Fed. Rep. of Germany | . |
| 3602652 | 9/1986 | Fed. Rep. of Germany | . |

OTHER PUBLICATIONS

T. J. Drummon et al., "A Novel Normally-Off Camel Diode Gate GaAs Field-Effect Transistor", Applied Physics Letters, vol. 40, No. 9, May 1982, pp. 834-836.
Patent Abstracts of Japan, vol. 7, No. 76, Mar. 1983.
Cooper, Jr. et al., "Contiguous-Domain Transferred-Electron Oscillators", IEEE MTT-S Digest, Jun. 1985, pp. 423-426.
Roger J. Malik, "The Design and Growth of GaAs Planar Doped Barriers by MBE", Materials Letters, vol. 1, No. 1, Jun. 1982, pp. 22-25.
J. M. Shannon et al., "Calculated Performance of Monolothic Hot-Electron Transistors", IEEE Proc., vol. 128, No. 4, Aug. 1982, pp. 134-140.
Serge Luryi et al., "Charge Injection Transistor Based on Real-Space Hot-Electron Transfer", IEEE Transactions on Electron Devices, vol. ED-31, No. 6, Jun. 1984, pp. 832-839.
Takashi Hotta et al., "A New AIGaAs/GaAs Heterojunction FET with Insulated Gate Structure (MISSFET)", Japanese Journal of Applied Physics, vol. 21, No. 2, Feb. 1982, pp. L122-L124.
D. Stephani et al., "A Field Emission E-Beam System for Nonometer Lithography", J. Vac. Sci. Technology, vol. 1, No. 4, Oct.-Dec. 1983, pp. 1011-1013.
V. Bögli et al., "Nanometer Scale Device Fabrication in a 100 keV E-Beam System", Microelectronic Engineering, vol. 3, 1985, pp. 117-123.
K. Ismail, "A Novel Method for Submicron Structurization Using Optical Projection Lithography", Microelectronic Engineering, 1, (1983), pp. 295-300.

*Primary Examiner*—Jerome Jackson, Jr.
*Attorney, Agent, or Firm*—Spencer & Frank

[57] ABSTRACT

The invention relates to a semiconductor arrangement consisting of a semiconductor substrate and arranged thereon a conductive semiconductor layer on which at least two ohmic connection electrodes are arranged in spaced lateral relationship to each other. The invention resides in selecting the conductive layer so thin that a depletion layer formed in the semiconductor layer between the ohmic connection electrodes produces, in the semiconductor layer, a potential distribution which acts as a majority carrier barrier.

20 Claims, 2 Drawing Sheets

SEMICONDUCTOR ARRANGEMENT WITH DEPLETION LAYER MAJORITY CARRIER BARRIER

BACKGROUND OF THE INVENTION

The invention relates to a semiconductor arrangement comprising a semiconductor substrate having arranged thereon a conductive semiconductor layer on which at least two ohmic connection electrodes are arranged in spaced relation to each other.

In new types of majority carrier devices, energetic barriers for majority carrier are produced by an extremely thin counter or positively doped layer embedded in a monocrystalline semiconductor material. For example, a separating layer which has an extremely high p-doping of above $10^{19}$ atoms/cm$^3$ and which is only approximately 10 nm thick is built into an n-conductive material with a doping of $10^{14}$ atoms/cm$^3$. Owing to the thinness of the counter-doped layer, only acceptors remain there and the mobile holes are completely eliminated. Such a PDB diode is described, for example, in the publication "Materials Letters, Volume 1, No. 1, June 82, Pages 22–25". This known diode has essentially the behavior of a Schottky diode with the advantage of relatively low noise because the barrier is arranged in the semiconductor volume and not on the semiconductor surface.

Furthermore, a vertical transistor configuration wherein hot charge carriers flow through an emission barrier into a thin base zone and are subsequently draw off through a second barrier adjoining it is known from the publication "IEE Proc., Volume 128, Pt. 1, No. 4, Aug. 81, Pages 134–140". In this transistor too, the barrier layers are formed by extremely narrow regions which are counterdoped with respect to the surrounding material. They are produced by diffusion or ion implantation and are so narrow that only the acceptors remain in them. The two barrier heights are altered with respect to each other by application of potential so that with sufficiently low dimensions of the base layer, hot electrons penetrate the first potential barrier and are drawn off through the second potential barrier.

SUMMARY OF THE INVENTION

The disadvantage of these above-described configurations is that the vertical layer sequence results in the occurrence of undesired parasitic capacitances. The object of the invention is to eliminate this disadvantage. This object is achieved, in accordance with the invention, in a semiconductor arrangement of the kind described at the beginning, by the conductive layer being selected so thin that a depletion layer arranged between the ohmic connection electrodes on or in the semiconductor layer produces in the semiconductor layer a potential distribution which acts as a majority carrier barrier.

The depletion layer is preferably formed by a Schottky contact which extends perpendicularly to the longitudinal extension of the conductive layer between the ohmic connection electrodes. It is, however, also possible for the depletion layer to be formed by an identically arranged counter-doped zone.

In a preferred embodiment of the invention, the conductive layer consists of a material, for example, GaAs, which is of narrow-band configuration in comparison with the material of the semiconductor substrate which, in this case, consists of GaAlAs. The depletion layer is preferably arranged asymmetrically between the ohmic connection electrodes in order to obtain a triangular barrier similar to the shape described in the publication "Materials Letters". Due to the asymmetrical arrangement of the depletion layer between the ohmic connection electrodes, a different characteristic for positive and negative voltages, similar to that of a Schottky diode, is also obtained. In contrast with the known vertical arrangements, the advantage of the inventive lateral arrangement is that the electrodes form a low mutual capacitance and the device can be produced by means of the known planar manufacturing method.

In an advantageous further development, a lateral transistor is realized using the inventive principle by two depletion layers being arranged parallel to each other between the two ohmic connection electrodes and by a third ohmic connection contact being disposed on the thin semiconductor layer between these depletion layers. The last aforementioned ohmic connection contact is then equivalent to the base connection which is otherwise common to bipolar transistors. To form controllable devices with only one depletion layer, it is also conceivable to apply a variable potential to the electrode connected to the depletion layer and to thus directly influence the height of the potential barrier.

The invention will now be explained in greater detail with reference to embodiments.

DESCRIPTION OF THE PREFERRED EMBODIMENTS

Figure 1:
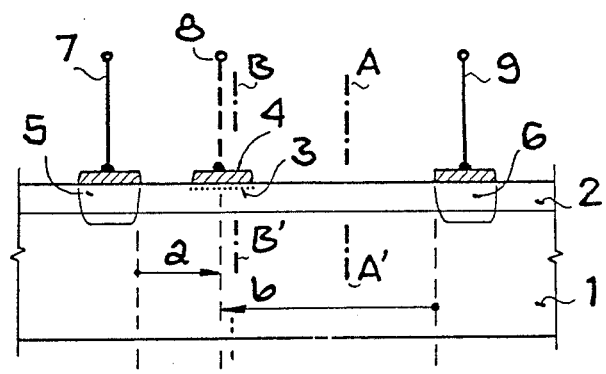
FIG. 1 shows a diode structure according to the invention.
Figure 2:
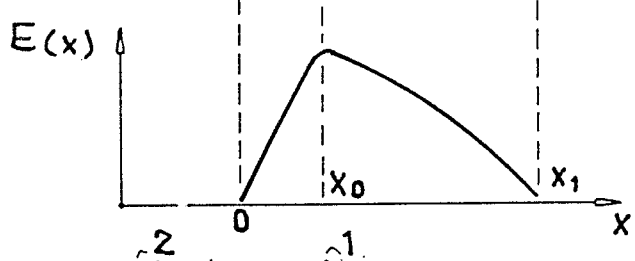
FIG. 2 shows the distribution of the potential in the conductive semiconductor layer.

To manufacture a diode structure with a majority carrier current, in accordance with FIG. 1, one starts with a semiconductor substrate (1) to which an extremely thin conductive layer (2) is applied. The thin conductive layer (2) is comprised of a material which is of narrow-band configuration in comparison with the semiconductor substrate (1) and which, consists, for example, of GaAs if the semiconductor substrate (1) consists of GaAlAs. The semiconductor layer (2) is, for example, n-doped and has a thickness of only approximately 50 nm. Arranged in a laterally spaced relationship to each other on this very thin conductive layer (2) are two ohmic connection electrodes (5,6) between which the majority carrier current flows during operation of the device. This majority carrier current just surmount a potential barrier whose course is illustrated in FIG. 2. The potential barrier is produced by the depletion layer (3) which is formed asymmetrically between the ohmic connection electrodes (5,6) and is preferably strip-shaped. The depletion layer strip extends perpendicularly to the direction of current flow between the connection electrodes (5,6). The depletion layer is preferably produced by a Schottky contact (4). It can, however, also be formed by an implanted counter-doped surface zone to form a pn-junction. The depletion layer has, for example, a thickness of only 10–20 nm and is preferably produced by electron beam lithography. In accordance with FIG. 1, the depletion layer (3) is produced by applying a metal contact (4) which forms a rectifying Schottky contact at the point of connection with the conductive layer (2).

The distance a between the depletion layer (3) and the one ohmic connection electrode (5) and the distance b between the depletion layer and the other ohmic connection electrode (6) are so selected that an asymmetrical potential barrier extends along the section O to $x_1$ (FIG. 2). The position of the applied electrode (4) forming the depletion layer at the point $x_0$ (FIG. 2), therefore, determines the course of the potential barrier. If $x_U$ were in the center between O and $x_1$, one would obtain a symmetrical potential barrier and the characteristic between the electrodes (5,6) would also be symmetrical. If, on the other hand, $x_U$ is arranged asymmetrically between 0 and $x_1$, as illustrated, a different characteristic of positive and negative voltages occurs in a similar manner as in a triangular barrier which is mentioned in the publication "Materials Letters" referred to at the beginning. To travel from one connection electrode to the other, the majority carriers in the conductive layer (2) must surmount this potential barrier with the aid of thermal energy. In one embodiment, the distance a is, for example, 50 nm and the distance b is 200 nm.

Figure 3:
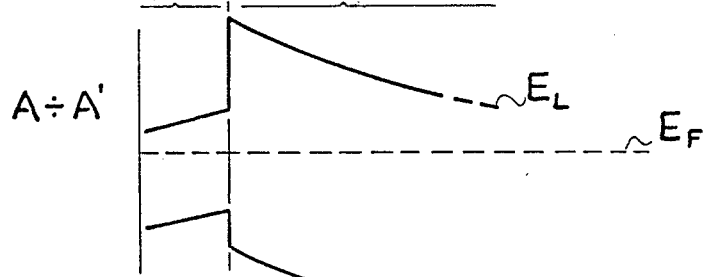
FIGS. 3 and 4 show the course of the bands along lines AA' and BB' of FIG. 1.
Figure 4:
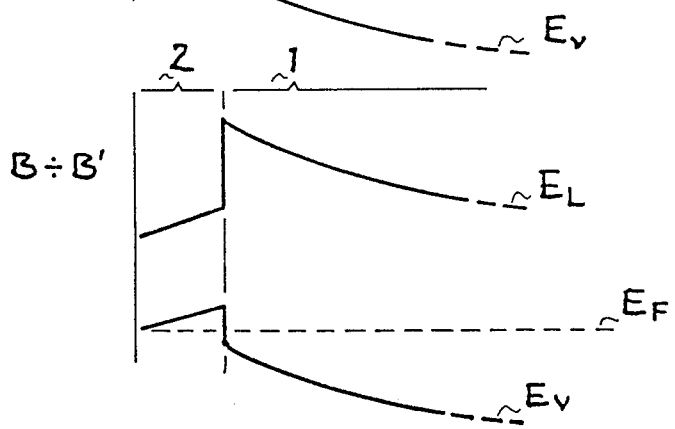

The associated band diagrams along lines AA' and BB' in accordance with FIG. 1 are illustrated in FIGS. 3 and 4, respectively. According to these Figures, lightly doped material is located on the broad-band gap substrate side, while a thin layer (2) of narrow-band gap semiconductor material is arranged on the surface. The effect of the potential barrier between zones (1) and (2) is that the charge carriers—in an n-conductive layer (2) the electrons—remain in the surface layer (2) and are freely mobile in this layer. At the point where a potential barrier occurs (section BB' according to FIG. 4) on account of the depletion layer (3), the potential of the band diagrams, as a whole, is strongly increased. This can even lead to the layer region of the layer (2) beneath and in closest proximity to the metal Schottky electrode (4) (FIG. 1) becoming inverted, which can result in the state of degeneracy. This state of degeneracy is assumed in the band diagram according to FIG. 4. Hence the region beneath the Schottky electrode (4) apparently consists of highly p-doped material and the lateral barrier occurring here corresponds to a barrier which in Camel diodes is caused by extreme counter-doping. In accordance with FIG. 1, the connection electrodes (5,6) are provided with respective potential connections (7,9). A connection electrode (8) to apply an external potential may also be provided on the Schottky contact (4). With this variable external potential at connection electrode (8), the height of the potential barrier in accordance with FIG. 2 and hence the electrical behavior of the semiconductor arrangement can be influenced.

Figure 5:
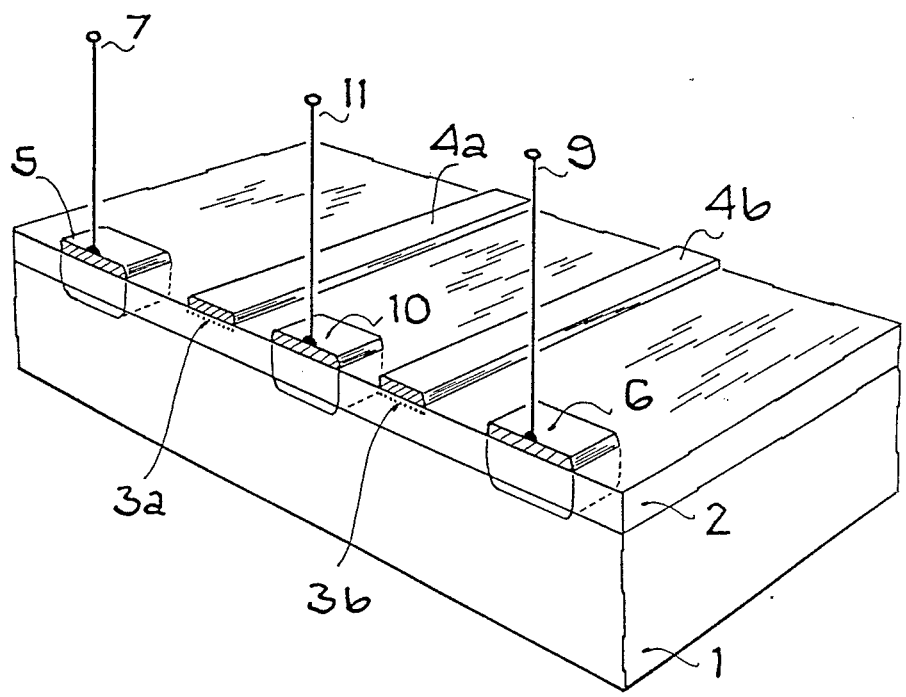
FIG. 5 shows the combination of two diode structures to form a hot electron transistor structure.

A hot electron transistor can be produced by a combination of two diodes or triangular barriers in accordance with Figure 1 and with appropriate geometry. A corresponding equivalent is illustrated in FIG. 5. According to FIG. 5, two asymmetrical arrangements according to FIG. 1 are arranged in mirror image. This structure then comprises two depletion layers (3a,3b) which are produced by Schottky contacts (4a,4b) on the conductive layer (2). Located equidistantly between these two Schottky contacts is an ohmic connection electrode (10) which can be considered equivalent to the base connection of a lateral transistor and which is provided with the connection (11). The two potential barriers produced by the depletion layers (3a) and (3b) are arranged symmetrically in relation to this connection electrode (10). Their distance from the outer connection electrodes (7) and (9) is larger than that from the center connection electrode (10), which results in triangular barriers. The distance between the potential maximum of the two potential values is preferably smaller than 0.2 $\mu$m. This slight distance between the two potential barriers must be chosen so as to ensure that electrons which travel beyond the barrier beneath the Schottky electrode (4a) are capable of passing, as hot electrons, the area in the region of the connection electrode (10) without considerable disturbance so as to then be able to surmount the potential barrier located beneath the Schottky electrode (4b) if suitable bias voltage is present at electrode (9).

In the embodiment according to FIG. 5, it is, in principle, also possible to additionally wire the Schottky electrodes (4a) and (4b), to thereby obtain modulation of the potential barriers beneath these Schottky contacts.

What is claimed is:

1. Semiconductor arrangement comprising a semiconductor substrate having a conductive semiconductor layer arranged thereon; at least two ohmic connection electrodes arranged in laterally spaced relationship to each other at an outer surface of said conductive layer; means for forming a depletion layer in said conductive layer adjacent said outer surface, and between and asymmetrically spaced from said two ohmic connection electrodes; and said conductive layer is so thin that said depletion layer in said conductive semiconductor layer between said ohmic connection electrodes produces, in said conductive semiconductor layer, a potential distribution E (x) which acts as a majority carrier barrier through which majority carriers must pass during current flow between said ohmic electrodes.

2. Semiconductor arrangement as defined in claim 1, wherein the said means for forming a depletion layer is a Schottky contact which extends perpendicularly to the longitudinal extension of the said conductive layer between the ohmic connection electrodes.

3. Semiconductor arrangement as defined in claim 1, wherein said means for forming a depletion layer is a zone which is oppositely doped with respect to said conductive layer and which extends perpendicularly to the longitudinal extension of the conductive layer between said two ohmic connection electrodes.

4. Semiconductor arrangement as defined in claim 1, wherein said conductive layer consists of narrow-band-gap material in comparison with the material of said semiconductor substrate.

5. Semiconductor arrangement as defined in claim 4, wherein said conductive layer consists of GaAs and said semiconductor substrate of GaAlAs.

6. Semiconductor arrangement as defined in claim 1, wherein said conductive layer is approximately 50 nm thick.

7. Semiconductor arrangement as defined in claim 1, wherein several of said means for forming a depletion layer arranged in parallel relation to each other, are formed in said conductive layer.

8. Semiconductive layer arrangement as defined in claim 7 wherein a respective further ohmic connection electrode is arranged between adjacent said means for forming a depletion layer on said conductive layer.

9. Semiconductor arrangement as defined in claim 7 wherein two of said means for forming a depletion layer are provided to form a majority carrier lateral transistor, and a further ohmic connection electrode is arranged symmetrically between, and equally spaced from, said two depletion layers on said conductive layer and corresponds to a base connection for said lateral transistor.

10. Semiconductor arrangement as defined in claim 1, wherein in order to form a controllable device with only one said depletion layer, a variable potential can be applied to an electrode connected to said depletion layer.

11. Semiconductor arrangement as defined in claim 1, wherein the said depletion layer has a width of approximately 10–20 nm.

12. Semiconductor arrangement as defined in claim 8, wherein said depletion layers are equally spaced from the respective said further electrode, but are differently spaced from the respective outer of said ohmic connection electrodes.

13. Semiconductor arrangement comprising: a semiconductor substrate having a conductive semiconductive layer arranged thereon; at least two ohmic connection electrodes arranged in laterally spaced relationship to each other at an outer surface of said conductive layer; a plurality of means for forming a depletion layer in said conductive layer adjacent said outer surface disposed in parallel between and spaced from said two ohmic electrodes; a respective further ohmic connection electrode arranged between adjacent said means for forming a depletion layer on said conductive layer; wherein said conductive layer is so thin that each said depletion layer in said conductive semiconductor layer between respective said ohmic connection electrodes produces, in said conductive semiconductor layer, a potential distribution E (x) which acts as a majority carrier barrier through which majority carriers must pass during current flow between ohmic electrodes; and wherein the distance between the maxima of the potential barriers in the region of said depletion layers is less than 0.2 $\mu$m.

14. Semiconductor arrangement as defined in claim 9, wherein said equal spacing of each of said depletion layers from the said further ohmic connecting electrode, is different than the spacing of said depletion layers from the respective adjacent outer of said two ohmic connection electrodes.

15. Semiconductor arrangement as defined in claim 14, wherein the distance between the maxima of the potential barriers in the regions of said two depletion layers is less than 0.2 $\mu$m.

16. Semiconductor arrangement comprising: a semiconductor substrate having a conductive semiconductor layer arranged thereon; first and second ohmic connection electrodes arranged at an outer surface of said conductive layer in laterally spaced relationship to each other; first and second means for forming respective depletion layers in said conductive layer adjacent said outer surface, said first and second means being disposed in parallel between and spaced from said first and second ohmic electrodes; a third ohmic connection electrode arranged symmetrically between the two said depletion layers on said conductive layer and corresponding to a base connection for a majority carrier lateral transistor; wherein said conductive layer is so thin that each said depletion layer in said conductive semiconductor layer between respective said ohmic connection electrodes produces, in said conductive semiconductor layer, a potential distribution E (x) which acts as a majority carrier barrier through which majority carriers must pass during current flow between said ohmic electrodes; and wherein the distance between the maxima of the potential barriers in the regions of said two depletion layers is less than 0.2 $\mu$m.

17. Semiconductor arrangement as defined in claim 9, wherein said conductive layer consists of narrow-bandgap material in comparison with the material of said semiconductor substrate.

18. Semiconductor arrangement as defined in claim 14 wherein said depletion layers are equally spaced from the respective adjacent one of said two ohmic connection electrodes.

19. Semiconductor arrangement as defined in claim 16 wherein said depletion layers are equally spaced from the respective adjacent one of said first and second ohmic connection electrodes.

20. Semiconductor arrangement as defined in claim 19 wherein the spacing between each of said depletion layers and said third ohmic connection electrode is less than the spacing between each of said depletion regions and the respective adjacent one of said first and second ohmic connection electrodes.

* * * * *